(12) United States Patent
Chung et al.

(10) Patent No.: US 9,111,890 B2
(45) Date of Patent: Aug. 18, 2015

(54) ORGANIC LIGHT EMITTING DISPLAY DEVICE

(71) Applicant: SAMSUNG DISPLAY CO., LTD., Yongin, Gyeonggi-Do (KR)

(72) Inventors: Jin-Koo Chung, Yongin (KR); Jun-Ho Choi, Yongin (KR); Seong-Min Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 126 days.

(21) Appl. No.: 13/658,638

(22) Filed: Oct. 23, 2012

(65) Prior Publication Data

US 2013/0187131 A1     Jul. 25, 2013

(30) Foreign Application Priority Data

Jan. 20, 2012  (KR) .................. 10-2012-0006809

(51) Int. Cl.
  *H01L 29/08*   (2006.01)
  *H01L 29/04*   (2006.01)
  *H01L 27/32*   (2006.01)

(52) U.S. Cl.
  CPC ....... *H01L 27/326* (2013.01); *H01L 2251/5323* (2013.01)

(58) Field of Classification Search
  CPC ............ H01L 27/326; H01L 2251/5323
  USPC ........................... 257/40, 59, 71, 72
  See application file for complete search history.

(56) References Cited

U.S. PATENT DOCUMENTS

| 2011/0205198 | A1 | 8/2011 | Jeong et al. |
| 2011/0215712 | A1 | 9/2011 | Hong |
| 2011/0272675 | A1 * | 11/2011 | Chung et al. .................... 257/40 |
| 2012/0074435 | A1 | 3/2012 | Ha et al. |

FOREIGN PATENT DOCUMENTS

| KR | 10-2007-0029007 | 3/2007 |
| KR | 10-2007-0034769 | 3/2007 |
| KR | 10-2011-0097046 | 8/2011 |
| KR | 10-2011-0100955 | 9/2011 |
| KR | 10-2011-0122513 | 11/2011 |
| KR | 10-2012-0031365 | 4/2012 |

* cited by examiner

*Primary Examiner* — Hung Vu

(74) *Attorney, Agent, or Firm* — Christie, Parker & Hale, LLP

(57) ABSTRACT

An organic light emitting display device including: a first emission area including a first organic light emitting diode; a second emission area arranged adjacent to the first emission area and not overlapping with the first emission area, the second emission area including a second organic light emitting diode; a pixel circuit unit electrically connected to the first organic light emitting diode and the second organic light emitting diode; and a transmissive area adjacent to the first and second emission areas and not overlapping with the first and second emission areas, the transmissive area configured to transmit external light therethrough.

25 Claims, 8 Drawing Sheets

ORGANIC LIGHT EMITTING DISPLAY DEVICE

CROSS-REFERENCE TO RELATED APPLICATION

This application claims priority to and the benefit of Korean Patent Application No. 10-2012-0006809, filed on Jan. 20, 2012 in the Korean Intellectual Property Office, the entire content of which is incorporated herein by reference.

BACKGROUND

1. Field

Aspects of embodiments of the present invention relate to organic light emitting display devices.

2. Description of the Related Art

Organic light emitting display devices generally have wide viewing angles, high contrast ratios, short response times, and reduced power consumption, and thus may be used across a variety of applications, such as personal portable devices (e.g., MP3 players and mobile phones), or large-screen displays (e.g., television sets).

An organic light emitting display device has self-emitting characteristics, and weight and thickness of the organic light emitting display device can be reduced since the organic light emitting display device does not require an additional light source, unlike a liquid crystal display (LCD) device.

Also, an organic light emitting display device can be manufactured as a transparent display device by including transparent thin-film transistors ( TFTs) and transparent organic light emitting diodes.

In a transparent display device, when the device is in an off-state, an image of an object or an image positioned at a side of the device opposite to a user is transmitted to the user through not only patterns of organic light emitting diodes, TFTs and various wires but also through spaces between the patterns. However, the patterns of organic light emitting diodes, TFTs, and wires do not have a high transmissivity, and the spaces between the patterns are not very high. Thus, the transmissivity of the entire transparent display device is typically not great.

Therefore, a distorted image may be transmitted to the user due to the patterns of organic light emitting diodes, TFTs, and wires. The reason for this is because gaps between the patterns are typically merely a few hundred nanometers, that is, almost equal to the wavelengths of visible light, thus causing light to scatter as it passes through the patterns.

An organic light emitting display device may be produced to be a dual-sided light emitting display device, compared to an LCD device. However, in the existing dual-sided light emitting display device, the same image is displayed on both surfaces thereof. Thus, the left and right sides of the image displayed on one of the surfaces are reversed relative to those of the image displayed on the other surface.

In addition, a dual-sided light emitting display device may be manufactured by separately manufacturing two organic light emitting display devices and binding them together. However, in this case, the dual-sided light emitting display device cannot be embodied as a transparent display device.

SUMMARY

According to an aspect of embodiments of the present invention, in an organic light emitting display device, transparent transmissive areas are formed by improving the transmissivity of the transmissive areas, and dual emission occurs.

According to another aspect of embodiments of the present invention, a transparent organic light emitting display device prevents or reduces distortion of an image transmitted therethrough by preventing or substantially preventing light from scattering during image display.

According to an embodiment of the present invention, an organic light emitting display device includes: a first emission area including a first organic light emitting diode; a second emission area arranged adjacent to the first emission area and not overlapping with the first emission area, the second emission area including a second organic light emitting diode; a pixel circuit unit electrically connected to the first organic light emitting diode and the second organic light emitting diode; and a transmissive area adjacent to the first and second emission areas and not overlapping with the first and second emission areas, the transmissive area configured to transmit external light therethrough.

The pixel circuit unit may be arranged to overlap with the first emission area and not to overlap with the second emission area.

The first organic light emitting diode may include a first pixel electrode configured to reflect light.

The second organic light emitting diode may include a second pixel electrode configured to transmit light therethrough.

The pixel circuit unit may individually drive the first organic light emitting diode and the second organic light emitting diode.

The pixel circuit unit may include a first light emitting thin film transistor (TFT) electrically connected to the first organic light emitting diode; and a second light emitting TFT electrically connected to the second organic light emitting diode.

The organic light emitting display device may further include a data line, a scan line, and a power supply source line for supplying a data signal, a scan signal, and power to the pixel circuit unit, respectively. The pixel circuit unit may include a first TFT, a second TFT, and a capacitor. In the first TFT, a gate electrode may be electrically connected to the scan line, a first electrode may be electrically connected to the data line, and a second electrode may be electrically connected to a gate electrode of the second TFT and the capacitor. In the second TFT, a first electrode may be electrically connected to the power supply source line and the capacitor, and a second electrode may be electrically connected to the first and second light emitting TFTs.

In the first light emitting TFT, a first electrode may be electrically connected to the second TFT, and a second electrode may be electrically connected to the first organic light emitting diode. In the second light emitting TFT, a first electrode may be electrically connected to the second TFT, and a second electrode may be electrically connected to the second organic light emitting diode.

The first organic light emitting diode and the second organic light emitting diode may emit a same color of light.

The organic light emitting display device may further include a transparent window arranged in the transmissive area.

According to another embodiment of the present invention, an organic light emitting display device includes: a substrate; a plurality of pixels formed on the substrate, each of the plurality of pixels including a first emission area, a second emission area, a transmissive area configured to transmit external light therethrough, and a pixel circuit unit; a plurality of first pixel electrodes, each being arranged in the first emission area of one of the plurality of pixels and electrically connected to the pixel circuit unit of the one of the plurality of pixels, each of the plurality of first pixel electrodes including a transparent conductive film and a reflective layer; a plurality of second pixel electrodes, each being arranged in the second emission area of a respective one of the plurality of pixels, electrically connected to the pixel circuit unit of the respective one of the plurality of pixels, and arranged apart from the plurality of first pixel electrodes, each of the plurality of second pixel electrodes including a transparent conductive film or a semi-transmissive layer; a first opposite electrode facing the plurality of first pixel electrodes; a second opposite electrode facing the plurality of second pixel electrodes; a first organic layer between the plurality of first pixel electrodes and the first opposite electrode, the first organic layer including a first emission layer; and a second organic layer between the plurality of second pixel electrodes and the second opposite electrode, the second organic layer including a second emission layer.

The first and second opposite electrodes may be electrically connected to each other.

The first opposite electrode may be configured to transmit light therethrough.

The first opposite electrode may be a reflective electrode.

The first opposite electrode and the second opposite electrode may each include at least one metal selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb).

Each of the pixel circuit units may be arranged to overlap with one of the plurality of first pixel electrodes and not to overlap with any of the plurality of second pixel electrodes.

Each of the pixel circuit units may include a first light emitting thin film transistor (TFT) electrically connected to one of the plurality of first pixel electrodes; and a second light emitting TFT electrically connected to one of the plurality of second pixel electrodes.

The organic light emitting display device may further include a data line, a scan line, and a power supply source line for supplying a data signal, a scan signal, and power to the pixel circuit unit, respectively. The pixel circuit unit may include a first TFT, a second TFT, and a capacitor. I the first TFT, a gate electrode may be electrically connected to the scan line, a first electrode may be electrically connected to the data line, and a second electrode may be electrically connected to a gate electrode of the second TFT and the capacitor. In the second TFT, a first electrode may be electrically connected to the power supply source line and the capacitor, and a second electrode may be electrically connected to the first and second light emitting TFTs.

In the first light emitting TFT, a first electrode may be electrically connected to the second TFT and a second electrode may be electrically connected to a first organic light emitting diode of a pixel of the plurality of pixels, and, in the second light emitting TFT, a first electrode may be electrically connected to the second TFT and a second electrode may be electrically connected to a second organic light emitting diode of the pixel of the plurality of pixels.

Each of the pixel circuit units may include a first pixel circuit unit electrically connected to one of the plurality of first pixel electrodes; and a second pixel circuit unit electrically connected to one of the plurality of second pixel electrodes, and being operated independently with the first pixel circuit unit.

The first pixel circuit unit and the second pixel circuit unit may be arranged to overlap with the first emission area and not to overlap with the second emission area.

The transmissive areas of at least two adjacent pixels from among the plurality of pixels may be integrally formed.

The organic light emitting display device may further include a plurality of transparent windows arranged in the transmissive areas.

The transparent windows of at least two adjacent pixels from among the plurality of pixels may be integrally formed.

The second opposite electrode may include a reflective metal film, and the reflective metal film may include a plurality of apertures, each corresponding to one of the first emission areas and one of the plurality of the transparent windows.

According to an aspect of embodiments of the present invention, a transparent organic light emitting display device may be manufactured by improving the transmissivity of external light and to allow dual emission to occur in the transparent organic light emitting display device.

According to another aspect of embodiments of the present invention, a transparent organic light emitting display device is capable of preventing or reducing distortion of an image transmitted therethrough by eliminating or substantially eliminating light-scattering during image display.

BRIEF DESCRIPTION OF THE DRAWINGS

The above and other features and aspects of the present invention will become more apparent by describing in further detail some exemplary embodiments thereof with reference to the attached drawings, in which.

DETAILED DESCRIPTION

In the following detailed description, some exemplary embodiments of the present invention are shown and described, by way of illustration. As those skilled in the art would realize, the described embodiments may be modified in various different ways, all without departing from the spirit or scope of the present invention. Accordingly, the drawings and description are to be regarded as illustrative in nature and not restrictive.

As used herein, the term "and/or" includes any and all combinations of one or more of the associated listed items. Expressions such as "at least one of," when preceding a list of elements, modify the entire list of elements and do not modify the individual elements of the list.

Figure 1:
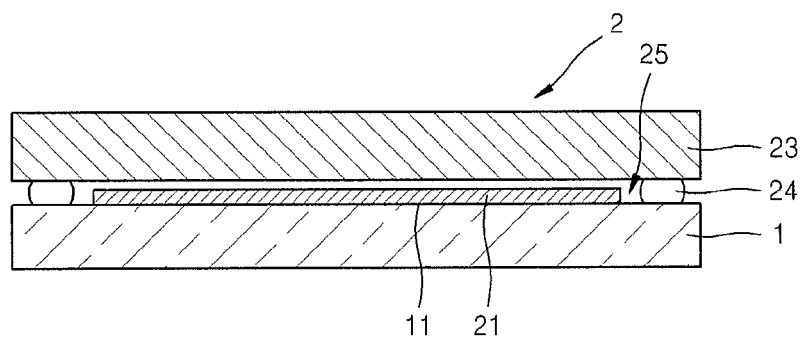
FIG. 1 is a cross-sectional view of an organic light emitting display device according to an embodiment of the present invention.

FIG. 1 is a cross-sectional view of an organic light emitting display device 2 according to an embodiment of the present invention. Referring to FIG. 1, the organic light emitting display device 2 includes an organic emission unit 21 formed on a first surface 11 of a substrate 1, and a sealing substrate 23 for sealing the organic emission unit 21.

The sealing substrate 23 may be formed of a transparent material to display an image generated by the organic emission unit 21, and to prevent or substantially prevent external air and moisture from penetrating into the organic emission unit 21.

A space 25 between the substrate 1 and the sealing substrate 23 is sealed by coupling edges of the substrate 1 and the sealing substrate 23 with sealing materials 24. The space 25 may be filled with an absorbent or a filler, as will be described later.

Figure 2:
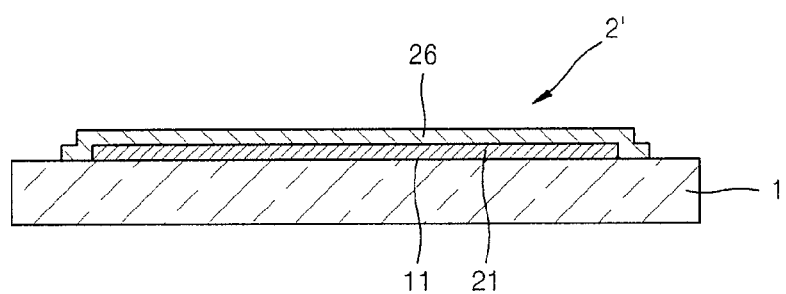
FIG. 2 is a cross-sectional view of an organic light emitting display device according to another embodiment of the present invention.

As illustrated in FIG. 2, in an organic light emitting display device 2' according to another embodiment of the present invention, a thin sealing film 26 instead of the sealing substrate 23 may be formed on the organic emission unit 21 to protect the organic emission unit 21 from external air and moisture. In one embodiment, the thin sealing film 26 may have a structure in which a film formed of an inorganic material (e.g., a silicon oxide or a silicon nitride), and a film formed of an organic material (e.g., epoxy or polyimide) are alternately stacked, but the present invention is not limited thereto. That is, in other embodiments, the thin sealing film 26 may include any thin film type sealing structure.

Figure 3:
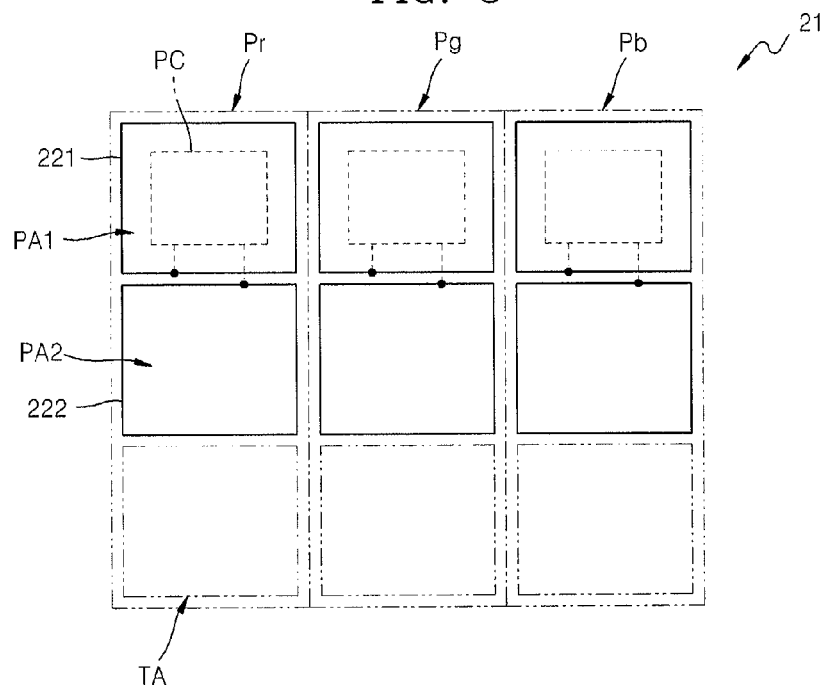
FIG. 3 is a schematic plan view of an organic emission unit according to an embodiment of the present invention.

FIG. 3 is a schematic plan view of an example of the organic emission unit 21 of FIG. 1 or FIG. 2, according to an embodiment of the present invention. Referring to FIG. 3, a red pixel Pr, a green pixel Pg, and a blue pixel Pb are arranged to be adjacent to one another in the organic emission unit 21.

Each of the red pixel Pr, the green pixel Pg, and the blue pixel Pb includes a first emission area PA1, a second emission area PA2, and a transmissive area TA.

In one embodiment, in each of the red pixel Pr, the green pixel Pg, and the blue pixel Pb, the first emission area PA1, the second emission area PA2, and the transmissive area TA are sequentially arranged to be adjacent to each other in a vertical direction, as illustrated in FIG. 3, but the present invention is not limited thereto. For example, in another embodiment, the transmissive area TA may be disposed above or between the first and second emission areas PA1 and PA2.

Referring to FIG. 3, each of the first emission areas PA1 includes a pixel circuit unit PC. Although not shown in FIG. 3, various wires connected to the pixel circuit unit PC may be disposed to pass through the first emission area PA1 or near the first emission area PA1.

Figure 4:
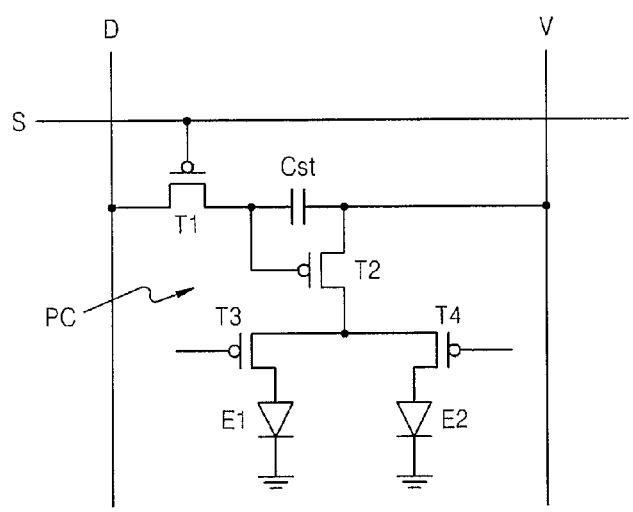
FIG. 4 is a circuit diagram of a pixel circuit unit of the organic emission unit of FIG. 3, according to an embodiment of the present invention.

FIG. 4 is a circuit diagram of the pixel circuit unit PC of FIG. 3, according to an embodiment of the present invention. Referring to FIG. 4, conductive lines (e.g., a scan line S, a data line D, and a Vdd line V which is a power supply voltage line) are electrically connected to the pixel circuit unit PC. Although not shown, various other conductive lines may further be connected to the pixel circuit unit PC according to a structure of the pixel circuit unit PC.

The pixel circuit unit PC, in one embodiment, includes a first thin-film transistor (TFT) T1 connected to the scan line S and the data line D, a second TFT T2 connected to the first TFT T1 and the Vdd line V, and a capacitor Cst connected to the first and second TFTs T1 and T2.

In the first TFT T1, a gate electrode is connected to the scan line S to receive a scan signal, a first electrode is connected to the data line D, and a second electrode is connected to the capacitor Cst, and a gate electrode of the second TFT T2.

In the second TFT T2, a first electrode is connected to the Vdd line V and the capacitor Cst, and a second electrode is connected to first electrodes of a first light emitting TFT T3 and a second light emitting TFT T4.

In one embodiment, the first TFT T1 may act as a switching transistor, and the second TFT T2 may act as a driving transistor.

In one embodiment, a second electrode of the first light emitting TFT T3 is electrically connected to a first organic light emitting diode E1, and a second electrode of the second light emitting TFT T4 is electrically connected to a second organic light emitting diode E2. Thus, referring to FIGS. 3 and 4, the second electrode of the first light emitting TFT T3 and the second electrode of the second light emitting TFT T4 are electrically connected to a first pixel electrode 221 and a second pixel electrode 222 of the organic emission unit 21, respectively.

Gate electrodes of the first light emitting TFT T3 and the second light emitting TFT T4 are electrically connected to additional emission signal lines (not shown), respectively.

In one embodiment, the TFTs T1 to T4 are P-type transistors, but the present invention is not limited thereto, and, in another embodiment, at least one of the TFTs T1 to T4 may be an N-type transistor. Although four TFTs and one capacitor are included in the pixel circuit unit PC according to one embodiment, the present invention is not limited thereto, and, in another embodiment, a combination of at least two TFTs and at least one capacitor may further be used according to a structure of the pixel circuit unit PC.

According to an embodiment of the present invention, the pixel circuit unit PC is disposed to overlap with the first emission area PA1 and not to overlap with the second emission area PA2.

As will be described below, top emission of each subpixel occurs in each of the first emission areas PA1. Since the pixel circuit unit PC is disposed in each of the first emission areas PA1 where top emission occurs, and a conductive pattern of the pixel circuit unit PC, which is an important factor that can degrade transmissivity, is not disposed in the transmissive area TA, the transmission of the transmissive area TA is greatly improved.

In other words, the pixel circuit unit PC overlaps with the first pixel electrode 221 to be hidden by the first pixel electrode 221, but does not overlap with the second pixel electrode 222.

In one embodiment, at least one of the conductive lines including the scan line S, the data line D, and the Vdd line V may be disposed to cross the first pixel electrode 221. Since transmissivity is decreased less by the conductive lines than by the pixel circuit unit PC, according to one embodiment, all of the conductive lines may be arranged adjacent to the first pixel electrode 221. The first pixel electrode 221 may include a reflective layer formed of conductive metal that reflects light, as described later herein, and the pixel circuit unit PC hidden by the first pixel electrode 221 may be screened by the first pixel electrode 221.

In each of the second emission areas PA2, bottom emission of each subpixel occurs. Since the pixel circuit unit PC is not disposed in each of the second emission areas PA2 where bottom emission occurs, the efficiency of bottom emission is not degraded.

According to the above-described structure of the pixel circuit unit PC, image information received via the data line D is displayed on the first organic light emitting diode E1 when the first light emitting TFT T3 is "off," and is displayed on the second organic light emitting diode E2 when the second light emitting TFT T4 is "off." Thus, different images may be displayed on the first organic light emitting diode E1 and the second organic light emitting diode E2. Accordingly, dual emission may be performed based on time-division driving in such a manner that the left and right sides of an image displayed on a surface on which top emission occurs without being reversed relative to those of an image displayed on a surface on which bottom emission occurs. However, if the same switching signal is supplied to the first light emitting TFT T3 and the second light emitting TFT T4 to which the same data signal is input, then the left and right sides of an image displayed on a front surface are reversed relative to those of an image displayed on a bottom surface. As described above, it is possible to display an image on the first organic light emitting diode E1 and the second organic light emitting diode E2 that share the basic structure of the pixel circuit unit PC, in various manners.

Figure 5:
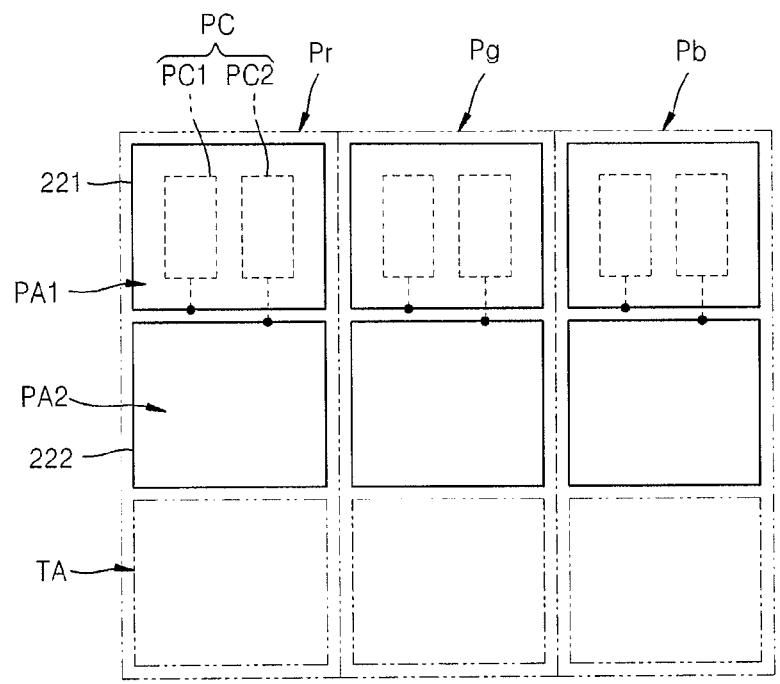
FIG. 5 is a schematic plan view of an organic emission unit according to another embodiment of the present invention.

Referring to FIG. 5, according to another embodiment of the present invention, the pixel circuit unit PC may include a first pixel circuit unit PC1 being electrically connected to the first pixel electrode 221, and a second pixel circuit unit PC2 being electrically connected to the second pixel electrode 222. The first pixel circuit unit PC1 and the second pixel circuit unit PC2 may be individually operated. The first pixel circuit unit PC1 and the second pixel circuit unit PC2 may have a structure of a general pixel circuit unit.

Referring to FIG. 3 or FIG. 5, a plurality of separate transmissive areas TA may be formed to correspond to a red pixel Pr, a green pixel Pg, and a blue pixel Pb, respectively, but the present invention is not limited thereto. For example, referring to FIG. 6, in another embodiment, a single transmissive area TA may be formed to correspond to all of the red pixel Pr, the green pixel Pg, and the blue pixel Pb. In this case, the area of the single transmissive area TA is greater than the sum of the areas of the separate transmissive areas TA of the previously described embodiments, thereby increasing the transmissivity of external light.

Figure 7:
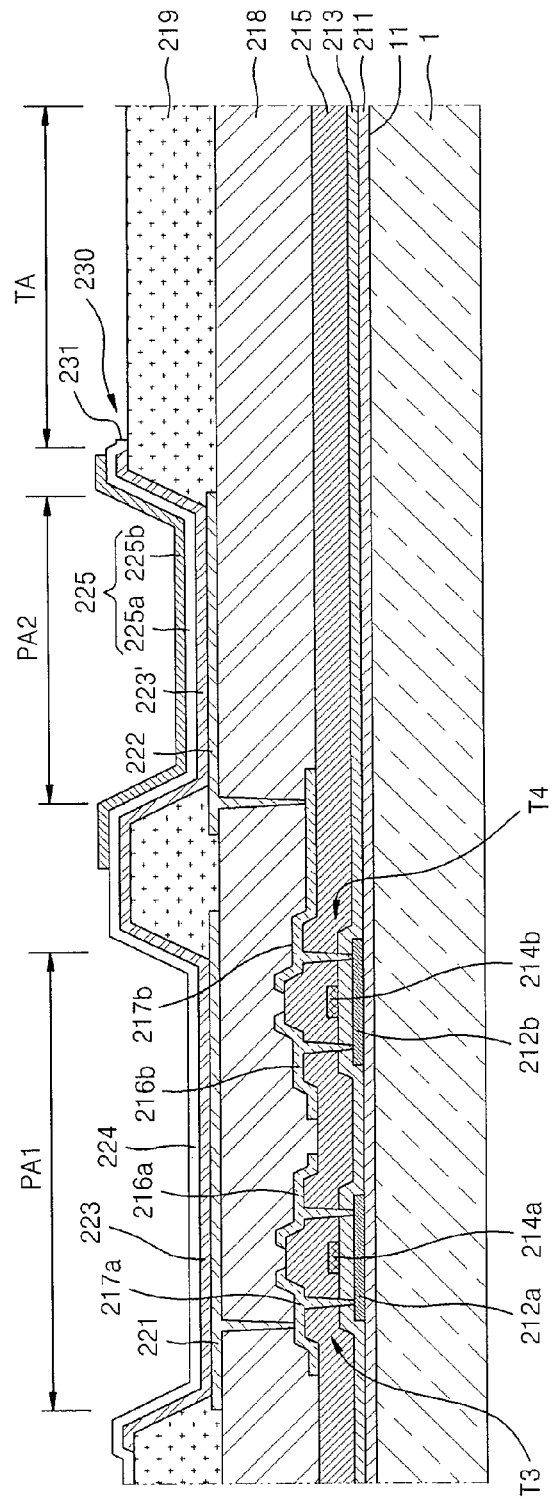
FIG. 7 is a cross-sectional view of the organic emission unit of FIG. 3, according to an embodiment of the present invention.

FIG. 7 is a cross-sectional view of a pixel of the organic emission unit 21, according to an embodiment of the present invention. In the organic emission unit 21, according to an embodiment of the present invention, a buffer film 211 is formed on the first surface 11 of the substrate 1, and the first light emitting TFT T3 and the second light emitting TFT T4 are formed on the buffer film 211. Although FIG. 7 illustrates only the first light emitting TFT T3 and the second light emitting TFT T4 for reasons of clarity, all the elements of the pixel circuit unit PC illustrated in FIG. 4 may be formed on the buffer film 211.

In one embodiment, a first semiconductor active layer 212a and a second semiconductor active layer 212b are formed on the buffer film 211.

The buffer film 211 prevents or substantially prevents impurity elements from penetrating into the organic emission unit 21 and planarizes a surface of the organic emission unit 21. The buffer film 211 may be formed of any of various materials to perform the functions described above. For example, the buffer film 211 may be formed of an inorganic material (e.g., a silicon oxide, a silicon nitride, a silicon oxynitride, an aluminum oxide, an aluminum nitride, a titanium oxide, or a titanium nitride), an organic material (e.g., polyimide, polyester, or acryl), or a stack of these materials. In another embodiment, the buffer film 211 may be omitted.

The first and second semiconductor active layers 212a and 212b, in one embodiment, may be formed of polycrystal silicon, but are not limited thereto, and, in another embodiment, for example, may be formed of an oxide semiconductor. For example, the first and second semiconductor active layers 212a and 212b may be G-I-Z-O layers [$(In_2O_3)a(Ga_2O_3)b(ZnO)c$ layer], wherein a, b, and c are integers that respectively satisfy $a \geq 0$, $b \geq 0$, and $c \geq 0$.

In one embodiment, a gate insulating film 213 covering the first and second semiconductor active layers 212a and 212b is formed on the buffer film 211, and first and second gate electrodes 214a and 214b are formed on the gate insulating film 213.

In one embodiment, an interlayer insulating film 215 is formed on the gate insulating film 213 to cover the first and second gate electrodes 214a and 214b. A first source electrode 216a and a first drain electrode 217a, and a second source electrode 216b and a second drain electrode 217b are formed on the interlayer insulating film 215 to be connected to the first semiconductor active layer 212a and the second semiconductor active layer 212b through contact holes, respectively.

The scan line S, in one embodiment, may be concurrently or simultaneously formed with the first and second gate electrodes 214a and 214b. The data line D and the Vdd line V, in one embodiment, may be concurrently or simultaneously formed with the first source electrode 216a and the second source electrode 216b.

However, the structures of the first and second light emitting TFTs TR3 and TR4 are not limited thereto, and any of various types of TFT structures may be employed.

In one embodiment, a passivation film 218 is formed to cover the first and second light emitting TFTs T3 and T4. The passivation film 218 may be a single layer or multiple layers of insulating film. The passivation film 218 may be formed of an inorganic material and/or an organic material.

Referring to FIG. 7, the first pixel electrode 221 covering the first and second light emitting TFTs T3 and T4 may be formed on the passivation film 218. The first pixel electrode 221 is connected to the first drain electrode 217a of the first light emitting TFT T3 through a via hole formed in the passivation film 218.

The second pixel electrode 222, in one embodiment, is formed on the passivation film 218 adjacent to the first pixel electrode 221. The first pixel electrode 221 and the second pixel electrode 222 are separated from each other. The second pixel electrode 222 is connected to the second drain electrode 217b of the second light emitting TFT T4 through a via hole formed in the passivation film 218.

In one embodiment, a pixel defining film 219 covering edges of the first pixel electrode 221 and the second pixel electrode 222 is formed on the passivation film 218.

A first organic layer 223 is formed on the first pixel electrode 221, and a first opposite electrode 224 is formed to cover the first organic layer 223.

A second organic layer 223' is formed on the second pixel electrode 222, and a second opposite electrode 225 is formed to cover the second organic layer 223'.

The first opposite electrode 224 and the second opposite electrode 225 may be electrically connected to each other, as illustrated in FIG. 7.

The same material may be used to form the first organic layer 223 and the second organic layer 223'. The first organic layer 223 and the second organic layer 223' may each be a low-molecular weight organic layer or a polymer organic layer having a high molecular weight. In one embodiment, the first organic layer 223 and the second organic layer 223' are each a low-molecular weight organic film, and may be formed by stacking a hole injection layer (HIL), a hole transport layer (HTL), an emission layer (EML), an electron transport layer (ETL), and an electron injection layer (EIL) in a single structure or a composite structure, and may be formed of any of various materials, such as copper phthalocyanine (CuPc), N,N'-Di(naphthalene-1-yl)-N,N'-diphenyl-benzidine (NPB), or tris-8-hydroxyquinoline aluminum (Alq3). The low-molecular weight organic layer may be formed by vacuum deposition. In this regard, the EML may be individually formed for each pixel, and the HIL, the HTL, the ETL, and the EIL may be common layers that are used in the pixels.

The first pixel electrode 221 and the second pixel electrode 222 may function as anode electrodes, and the first opposite electrode 224 and the second opposite electrode 225 may function as cathode electrodes, or vice versa.

In one embodiment, the first pixel electrode 221 may have a size corresponding to that of the first emission area PA1 of each pixel, and the second pixel electrode 222 may have a size corresponding to that of the second emission area PA2 of each pixel.

A common voltage may be applied to the first and second opposite electrodes 224 and 225 of all of the pixels of the organic emission layer 21.

The passivation film 218, the gate insulating film 213, the interlayer insulating film 215, and the pixel defining film 219 may be formed as transparent insulating films, but the present invention is not limited thereto. In one embodiment, the substrate 1 may have a transmissivity less than or equal to a total transmissivity of the transparent insulating films.

Figure 8A:
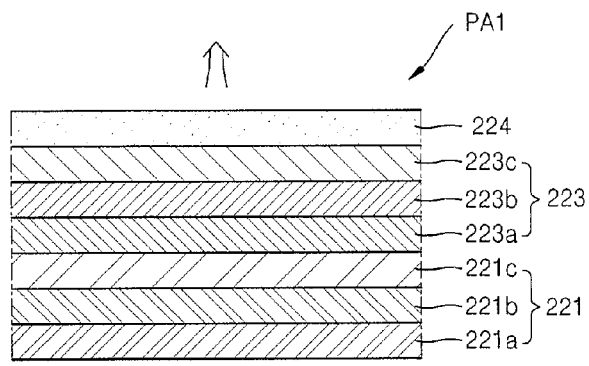
FIG. 8A is a schematic cross-sectional view of a first organic light emitting diode in a first emission area of the organic emission unit of FIG. 7, according to an embodiment of the present invention.
Figure 8B:
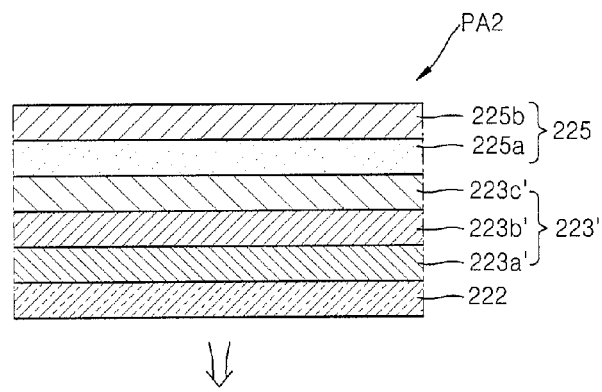
FIG. 8B is a schematic cross-sectional view of a second organic light emitting diode in a second emission area of the organic emission unit of FIG. 7, according to an embodiment of the present invention.

FIG. 8A is a schematic cross-sectional view of a first organic light emitting diode in the first emission area PA1 of FIG. 7, according to an embodiment of the present invention. FIG. 8B is a schematic cross-sectional view of a second organic light emitting diode in the second emission area PA2 of FIG. 7, according to an embodiment of the present invention.

According to an embodiment of the present invention, the first pixel electrode 221 may be an electrode including a reflective layer, and the first opposite electrode 224 may be a semi-transparent and semi-reflective electrode. Accordingly, the first emission area PA1 may be a top emission type area in which an image is displayed toward the first opposite electrode 224.

In one embodiment, the first pixel electrode 221 is a reflective electrode, and the pixel circuit unit PC disposed under the first pixel electrode 221 is covered by the first pixel electrode 221. Thus, referring to FIG. 7, patterns of the first light emitting TFT T3 and the second light emitting TFT T4 under the first pixel electrode 221 are not visible at an outer side above the first opposite electrode 224.

As the first pixel electrode 221 is a reflective electrode, light is emitted only toward a user, thereby preventing or reducing optical loss in a direction opposite to the user.

In one embodiment, the second pixel electrode 222 is a transparent electrode, and the second opposite electrode 225 is a reflective electrode. In this case, the second emission area PA2 is a bottom emission type area in which an image is displayed toward the second pixel electrode 222.

The first pixel electrode 221, in one embodiment, may be a stacked structure of a first transparent conductive film 221a, a reflective layer 221b, and a second transparent conductive film 221c. The first transparent conductive film 221a and the second transparent conductive film 221c may each include an oxide having a high work function, such as ITO, IZO, ZnO, or $In_2O_3$. The reflective layer 221b may be formed of a metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or an alloy thereof, as described above.

The first organic layer 223, in one embodiment, is a stacked structure of a first functional layer 223a, a first emission layer 223b, and a second functional layer 223c formed on the first pixel electrode 221. The first opposite electrode 224 is formed on the first organic layer 223.

The first functional layer 223a may include an HIL and a HTL, and the second functional layer 223c may include an EIL and an ETL.

The first opposite electrode 224 may be formed of a metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or an alloy thereof. The first opposite electrode 224 may be a thin film having a high transmissivity, and may be formed having a thickness of about 100 to 300 Å.

A distance between a surface of the reflective layer 221b and the first opposite electrode 224 may be adjusted to cause optical resonance to occur, based on a wavelength of light emitted from the first emission layer 223b. The distance may be different for red, green, and blue pixels. For optical resonance, the distance may be adjusted by further forming an auxiliary layer on the first functional layer 223a and/or the second functional layer 223c to a thickness according to the color of a pixel.

The first emission area PA1 having the above-described structure is a top emission type area in which an image is displayed toward the opposite electrode 224, and light extraction efficiency may be increased or maximized by adjusting the distance between a surface of the reflective layer 221b and the first opposite electrode 224.

Figure 8C:
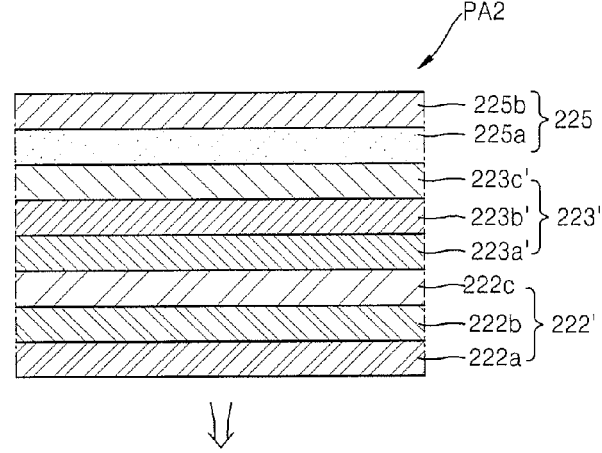
FIG. 8C is a schematic cross-sectional view of a second organic light emitting diode in a second emission area of an organic emission unit, according to another embodiment of the present invention.

As described above, the second pixel electrode 222 is formed of a transparent conductive material having a low reflectivity. Thus, the second pixel electrode 222 may be formed concurrently or simultaneously with at least one of the first transparent conductive film 221a and the second transparent conductive film 221c included in the first pixel electrode 221. However, the present invention is not limited thereto, and a second pixel electrode 222' according to another embodiment of the present invention may be a stacked structure of a first transparent conductive film 222a, a reflective layer 222b, and a second transparent conductive film 222c, as shown in FIG. 8C. The first transparent conductive film 222a and the second transparent conductive film 222c may include an oxide having a high work function, such as ITO, IZO, ZnO, or $In_2O_3$. The reflective layer 222b may have a semi-transparent characteristic by being formed of a thin film metal, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or an alloy thereof. In one embodiment, the first transparent conductive film 222a, the reflective layer 222b, and the second transparent conductive film 222c of the second pixel electrode 222' may be formed concurrently or simultaneously with the first transparent conductive film 221a, the reflective layer 221b, and the second transparent conductive film 221c of the first pixel electrode 221, respectively.

The second organic layer 223', in one embodiment, is a stacked structure including a third functional layer 223a', a second emission layer 223b', and a fourth functional layer 223c' formed on the second pixel electrode 222. The second opposite electrode 225 is formed on the second organic layer 223'. The third functional layer 223a' and the fourth functional layer 223c' may extend from the first functional layer 223a and the second functional layer 223c, respectively. In an embodiment where the second emission layer 223b' has the same color as that of the first emission layer 223b, the second emission layer 223b' may extend from the first emission layer 223b.

Figure 8D:
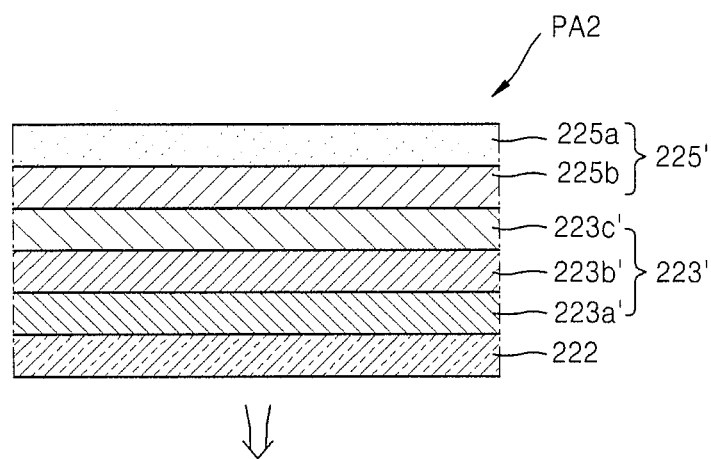
FIG. 8D is a schematic cross-sectional view of a second organic light emitting diode in a second emission area of an organic emission unit, according to another embodiment of the present invention.

In one embodiment, the second emission area PA2 is a bottom emission type area in which an image is displayed toward the second pixel electrode 222, and the second opposite electrode 225 may include a semi-transmissive film 225a and a metal film 225b. The semi-transmissive film 225a may be formed of a material used to form the first opposite electrode 224, and may extend from the first opposite electrode 224. The metal film 225b may be stacked on the semi-transmissive film 225a and may function as a reflective layer. The metal film 225b may be formed of a metal having a low work function, such as silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), ytterbium (Yb), or an alloy thereof. The metal film 225b, in one embodiment, may be formed to be thicker than the semi-transmissive film 225a so as to increase the reflectivity of light emitted from the second organic layer 223' and reduce a voltage drop in the second opposite electrode 225. With reference to FIG. 8D, in a second opposite electrode 225' according to another embodiment of the present invention, the metal film 225b may be formed before the semi-transmissive film 225a is formed. In this case, the second opposite electrode 225' has a structure in which the metal film 225b and the semi-transmissive film 225a are sequentially stacked.

In one embodiment, the semi-transmissive film 225a of the second opposite electrode 225 may be integrally formed with the first opposite electrode 224.

Figure 8E:
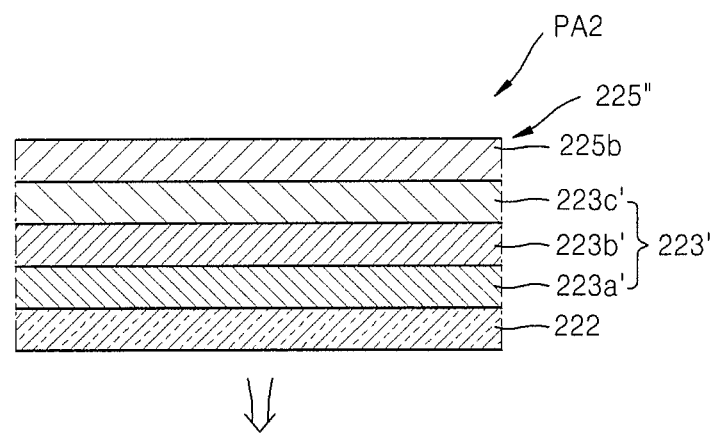
FIG. 8E is a schematic cross-sectional view of a second organic light emitting diode in a second emission area of an organic emission unit, according to another embodiment of the present invention.

However, the present invention is not limited thereto, and a second opposite electrode 225" according to another embodiment of the present invention may include only the metal film 225b if needed, as illustrated in FIG. 8E.

Similarly, the above various embodiments of the structure of the second opposite electrode 225' and 225" may also be applied with the structure of the second pixel electrode 222' illustrated in FIG. 8C.

Although FIG. 7 illustrates that the second opposite electrode 225 is a stacked structure of the semi-transmissive film 225a and the metal film 225b as illustrated in FIG. 8B, the present invention is not limited thereto, and, in other embodiments, the second emission area PA2 shown in FIG. 7 may include the second opposite electrode 225' that is a stacked structure of the metal film 225b and the semi-transmissive film 225a, as illustrated in FIG. 8D, or may include the second opposite electrode 225" that is only the metal film 225b, as illustrated in FIG. 8E.

The metal film 225b, in one embodiment, may be formed not to extend at least to the transmissive area TA, as illustrated in FIG. 7.

According to an embodiment of the present invention, a transparent window 230 may be formed in the transmissive area TA to greatly increase the transmittance of external light through the transmissive area TA, as illustrated in FIG. 7.

The transparent window 230 may have an area corresponding to the transmissive area TA. Referring to FIG. 7, a first transparent window 231 may be formed by forming an aperture in the first opposite electrode 224 and the second opposite electrode 225 at a location corresponding to the transmissive area TA such that the first opposite electrode 224 and the second opposite electrode 225 are not formed in the transmissive area TA. In one embodiment, the first transparent window 231 improves the transmittance of external light through the transmissive area TA.

Figure 9:
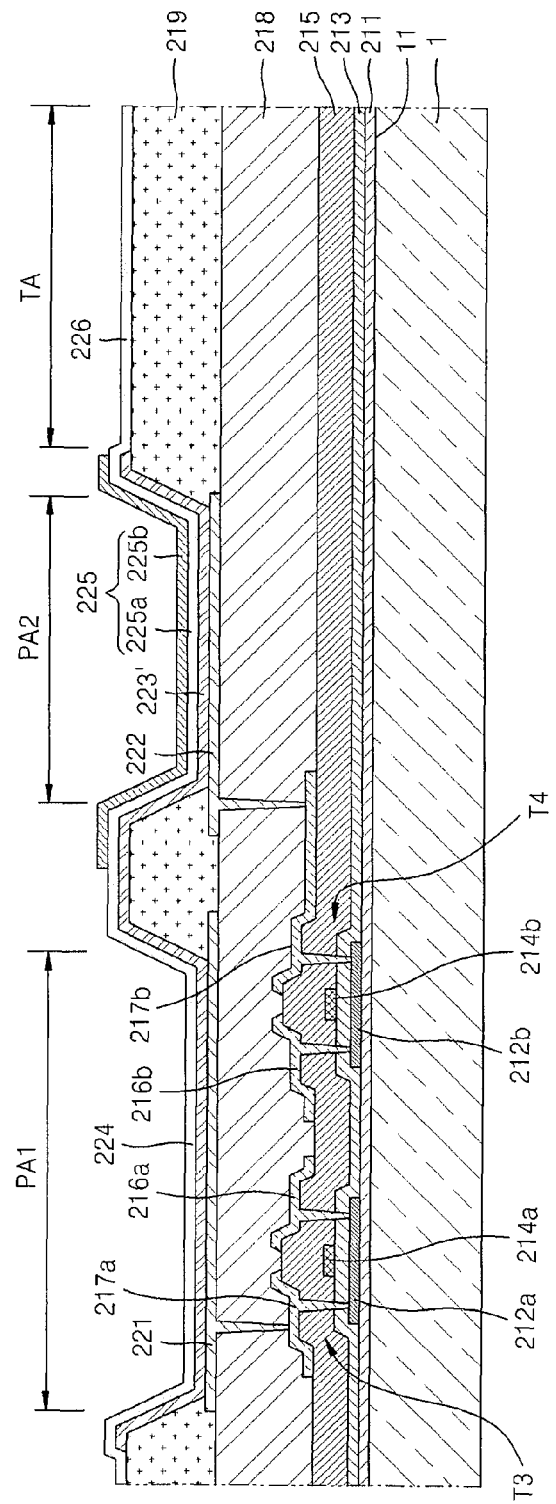
FIG. 9 is a cross-sectional view of an organic emission unit according to another embodiment of the present invention.

However, the present invention is not limited thereto, and, in another embodiment, an extended opposite electrode 226 may be formed in the transmissive area TA, as illustrated in FIG. 9. The extended opposite electrode 226 may be formed of a material used to form the first opposite electrode 224 and the semi-transmissive film 225a, and may extend from the semi-transmissive film 225a. By forming the extended opposite electrode 226 in the transmissive area TA, it is not needed to pattern a semi-transmissive film extending from the first opposite electrode 224 and the semi-transmissive film 225a, thereby facilitating the manufacture of an organic light emitting display device.

When the second opposite electrode 225, 225', 225" includes the metal film 225b as illustrated in FIG. 8B, 8D, or 8E, the metal film 225b may have apertures corresponding to the first emission area PA1 and the transmissive area TA as illustrated in FIG. 7 or FIG. 9. The aperture in the metal film 225b corresponding to the transmissive area TA may be formed to correspond to the first transparent window 231. Thus, it is possible to increase light extraction efficiency of the first emission area PA1 in which top emission occurs, and the transmittance of external light through the transmissive area TA.

Figure 10:
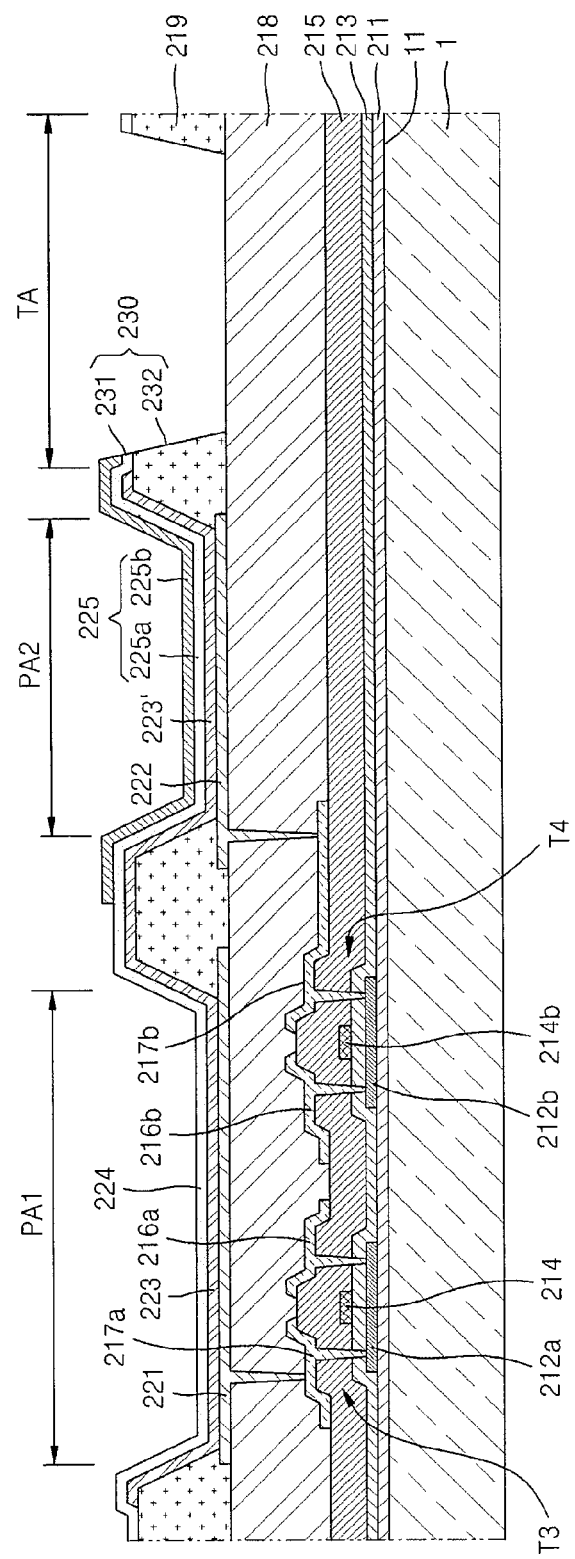
FIG. 10 is a cross-sectional view of an organic emission unit according to another embodiment of the present invention.

FIG. 10 is a cross-sectional view of an organic emission unit according to another embodiment of the present invention. In the organic emission unit of FIG. 10, a second transparent window 232 is formed in the pixel defining film 219. The second transparent window 232 may be connected to the first transparent window 231, such as that shown in FIG. 7, thus forming the transparent window 230. In FIG. 10, the second transparent window 232 is shown formed only in the pixel defining film 219, but the present invention is not limited thereto, and, in another embodiment, the second transparent window 232 may be formed in at least one of the insulating films formed in the transmissive area TA.

The second transparent window 232, in one embodiment, increases the transmissivity of the transmissive area TA, and may also prevent or reduce optical interference, degradation in color purity, and a change in color, caused by multilayered transparent insulating films.

Although not shown, in another embodiment, the transparent window 230 may include only the second transparent window 232, and a first transparent window which is an aperture may not be formed in the extended opposite electrode 226.

Figure 6:
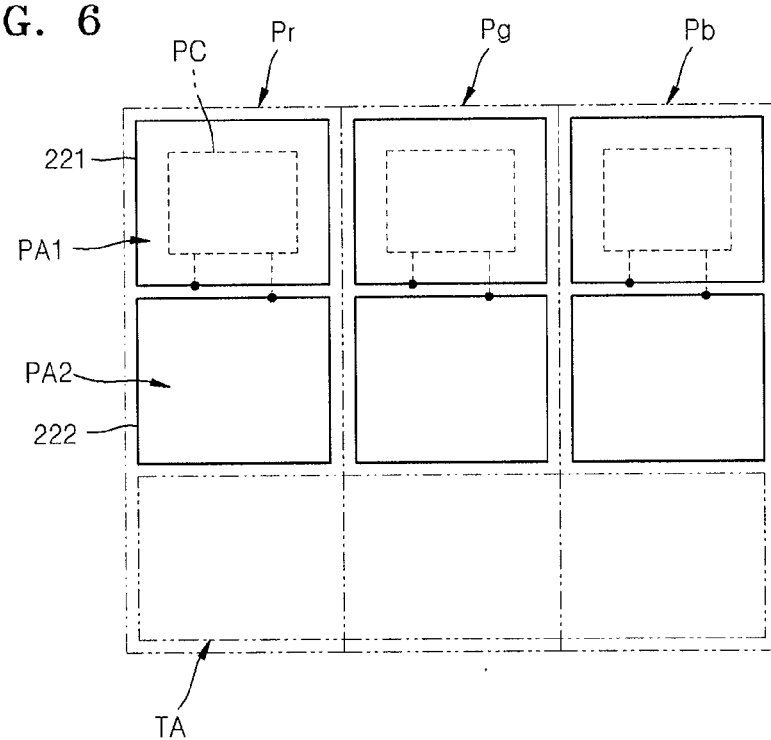
FIG. 6 is a schematic plan view of an organic emission unit according to another embodiment of the present invention.

In one embodiment, a plurality of the transparent windows each corresponding to the shape of the transmissive area TA may be formed separately for the red pixel Pr, the green pixel Pg, and the blue pixel Pb, as illustrated in FIG. 3. In another embodiment, a single transmissive area TA corresponds to all of the red pixel Pr, the green pixel Pg, and the blue pixel Pb, as illustrated in FIG. 6, and a transparent window may be formed for all of the red pixel Pr, the green pixel Pg, and the blue pixel Pb.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. An organic light emitting display device comprising:
    a first emission area comprising a first organic light emitting diode;
    a second emission area arranged adjacent to the first emission area and not overlapping with the first emission area, the second emission area comprising a second organic light emitting diode;
    a pixel circuit unit electrically connected to the first organic light emitting diode and the second organic light emitting diode; and
    a transmissive area adjacent to the first and second emission areas and not overlapping with the first and second emission areas, the transmissive area configured to transmit external light therethrough.

2. The organic light emitting display device of claim 1, wherein the pixel circuit unit is arranged to overlap with the first emission area and not to overlap with the second emission area.

3. The organic light emitting display device of claim 1, wherein the first organic light emitting diode comprises a first pixel electrode configured to reflect light.

4. The organic tight emitting display device of claim 1, wherein the second organic light emitting diode comprises a second pixel electrode configured to transmit light therethrough.

5. The organic light emitting display device of claim 1, wherein the pixel circuit unit individually drives the first organic light emitting diode and the second organic light emitting diode.

6. The organic light emitting display device of claim 1, wherein the pixel circuit unit comprises:
    a first light emitting thin film transistor (TFT) electrically connected to the first organic light emitting diode; and
    a second light emitting TFT electrically connected to the second organic light emitting diode.

7. The organic light emitting display device of claim 6, further comprising a data line, a scan line, and a power supply source line for supplying a data signal, a scan signal, and power to the pixel circuit unit, respectively,
    wherein the pixel, circuit unit comprises a first TFT, a second TFT, and a capacitor,
    wherein, in the first TFT, a gate electrode is electrically connected to the scan line, a first electrode is electrically connected to the data line, and a second electrode is electrically connected to a gate electrode of the second TFT and the capacitor, and
    wherein, in the second TFT, a first electrode is electrically connected to the power supply source line and the capacitor, and a second electrode is electrically connected to the first and second light emitting, TFTs.

8. The organic light emitting display device of claim 7,
    wherein, in the first light emitting TFT, a first electrode is electrically connected to the second TFT and a second electrode is electrically connected to the first organic light emitting diode, and
    wherein, in the second light emitting TFT, a first electrode is electrically connected to the second TFT, and a second electrode is electrically connected to the second organic light emitting diode.

9. The organic light emitting display device of claim 1, wherein the first organic light emitting diode and the second organic light emitting diode emit a same color of light.

10. The organic light emitting display device of claim 1, further comprising a transparent window arranged in the transmissive area.

11. An organic light emitting display device comprising:
    a substrate;
    a plurality of pixels formed on the substrate, each of the plurality of pixels including a first emission area, a second emission area, a transmissive area configured to transmit external light therethrough, and a pixel circuit unit;
    a plurality of first pixel electrodes, each being arranged in the first emission area of one of the plurality of pixels and electrically connected to the pixel circuit unit of the one of the plurality of pixels, each of the plurality of first pixel electrodes comprising a transparent conductive film and a reflective layer;
    a plurality of second pixel electrodes, each being arranged in the second emission area of a respective one of the plurality of pixels, electrically connected to the pixel circuit unit of the respective one of the plurality of pixels, and arranged apart from the plurality of first pixel electrodes, each of the plurality of second pixel electrodes including a transparent conductive film or a semi-transmissive layer;
    a first opposite electrode facing the plurality of first pixel electrodes;
    a second opposite electrode facing the plurality of second pixel electrodes;
    a first organic layer between the plurality of first pixel electrodes and the first opposite electrode, the first organic layer including a first emission layer; and
    a second organic layer between the plurality of second pixel electrodes and the second opposite electrode, the second organic layer including a second emission layer.

12. The organic light emitting display device of claim 11, wherein the first and second opposite electrodes are electrically connected to each other.

13. The organic light emitting display device of claim 11, wherein the first opposite electrode is configured to transmit light therethrough.

14. The organic light emitting display device of claim 11, wherein the second opposite electrode is a reflective electrode.

15. The organic light emitting display device of claim 11, wherein the first opposite electrode and the second opposite electrode each comprise at least one metal selected from the group consisting of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), and ytterbium (Yb).

16. The organic light emitting display device of claim 11, wherein each of the pixel circuit units is arranged to overlap with one of the plurality of first pixel electrodes and not to overlap with any of the plurality of second pixel electrodes.

17. The organic light emitting display device of claim 11, wherein each of the pixel circuit units comprises:
- a first light emitting thin film transistor (TFT) electrically connected to one of the plurality of first pixel electrodes; and
- a second light emitting TFT electrically connected to one of the plurality of second pixel electrodes.

18. The organic light emitting display device of claim 17, further comprising a data line, a scan line, and a power supply source line for supplying a data signal, a scan signal, and power to the pixel circuit unit, respectively,
- wherein the pixel circuit unit comprises a first TFT, a second TFT, and a capacitor,
- wherein, in the first TFT, a gate electrode is electrically connected to the scan line, a first electrode is electrically connected to the data line, and a second electrode is electrically connected to a gate electrode of the second TFT and the capacitor, and
- wherein, in the second TFT, a first electrode is electrically connected to the power supply source line and the capacitor, and a second electrode is electrically connected to the first and second light emitting TFTs.

19. The organic light emitting display device of claim 18, wherein, in the first light emitting TFT, a first electrode is electrically connected to the second TFT and a second electrode is electrically connected to a first organic light emitting diode of a pixel of the plurality of pixels, and
- wherein, in the second light emitting TFT, a first electrode is electrically connected to the second TFT and a second electrode is electrically connected to a second organic light emitting diode of the pixel of the plurality of pixels.

20. The organic light emitting display device of claim 11, wherein each of the pixel circuit units comprises:
- a first pixel circuit unit electrically connected to one of the plurality of first pixel electrodes; and
- a second pixel circuit unit electrically connected to one of the plurality of second pixel electrodes, and being operated independently with the first pixel circuit unit.

21. The organic light emitting display device of claim 20, wherein the first pixel circuit unit and the second pixel circuit unit are arranged to overlap with the first emission area and not to overlap with the second emission area.

22. The organic light emitting display device of claim 11, wherein the transmissive areas of at least two adjacent pixels from among the plurality of pixels are integrally formed.

23. The organic light emitting display device of claim 11, further comprising a plurality of transparent windows arranged in the transmissive areas.

24. The organic light emitting display device of claim 23, wherein the transparent windows of at least two adjacent pixels from among the plurality of pixels are integrally formed.

25. The organic light emitting display device of claim 23,
- wherein the second opposite electrode comprises a reflective metal film, and
- wherein the reflective metal film comprises a plurality of apertures, each corresponding to one of the first emission areas and one of the plurality of the transparent windows.

* * * * *